(12) United States Patent
Luick

(10) Patent No.: US 7,065,694 B2
(45) Date of Patent: Jun. 20, 2006

(54) ADAPTIVE RUNTIME REPAIRABLE ENTRY REGISTER FILE

(75) Inventor: David Arnold Luick, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 442 days.

(21) Appl. No.: 10/670,713

(22) Filed: Sep. 25, 2003

(65) Prior Publication Data
US 2005/0071723 A1    Mar. 31, 2005

(51) Int. Cl.
*G06F 11/00*    (2006.01)
(52) U.S. Cl. .................. 714/747; 714/763
(58) Field of Classification Search ........... 365/201, 365/200, 49; 714/718, 747, 763; 712/213, 712/217; 711/108
See application file for complete search history.

(56) References Cited

U.S. PATENT DOCUMENTS

| | | | | |
|---|---|---|---|---|
| 5,909,404 A | * | 6/1999 | Schwarz | ............ 365/201 |
| 5,956,350 A | * | 9/1999 | Irrinki et al. | ............ 714/718 |
| 6,304,498 B1 | * | 10/2001 | Ikeda | ............ 365/200 |
| 6,460,132 B1 | * | 10/2002 | Miller | ............ 712/213 |
| 6,611,445 B1 | * | 8/2003 | Kanazawa et al. | ............ 365/49 |
| 6,728,123 B1 | * | 4/2004 | Batson et al. | ............ 365/49 |
| 6,748,519 B1 | * | 6/2004 | Moore | ............ 712/217 |
| 6,791,855 B1 | * | 9/2004 | Batson et al. | ............ 365/49 |
| 6,839,257 B1 | * | 1/2005 | Narita et al. | ............ 365/49 |
| 6,920,525 B1 | * | 7/2005 | Chadwick et al. | ............ 711/108 |

* cited by examiner

*Primary Examiner*—David Ton
(74) *Attorney, Agent, or Firm*—Robert R. Williams

(57) ABSTRACT

Methods and apparatus are disclosed that provide for improved addressing of a register file in a computer system. The register file has one or more redundant words. A logical address in an instruction is mapped, during a predecode operation, to a physical address having a larger address space than the logical address. Addresses of nonfaulty words are mapped to the same word in the larger address space as the logical address. Logical addresses that point to faulty words are mapped to a redundant word that is in the larger address space but not in the address space of the logical address. Because all addresses presented to a register file decoder at access time point to nonfaulty words, no delay penalty associated with address compare during the access time is required.

18 Claims, 6 Drawing Sheets

ADAPTIVE RUNTIME REPAIRABLE ENTRY REGISTER FILE

BACKGROUND OF THE INVENTION

1. Field of the Invention

The present invention generally relates to electronic systems having multiple levels in a memory hierarchy. More specifically, the present invention relates to addressing of redundant words in a register file.

2. Description of the Related Art

Modern electronic data processing systems (computer systems) typically have memory hierarchies. Memory hierarchies are dictated by economic and performance considerations. Memory hierarchies are made up of a plurality of groups of storage. Very fast storage, usually called "Level 1" cache is placed near a processor in the data processing system. A computer system typically has a level 1 instruction cache that holds instructions, and a level 1 data cache that holds data. "Level 2" cache, having capacity to store more data, but requiring longer to access is the next level of the memory hierarchy. Some computer systems have a "Level 3" cache having more storage than the level 2 cache but requiring even more time to access.

Computer systems also have register files, typically made up of groups of latches, that are used for "scratchpad" storage, and are directly addressed by instructions executed by the processor.

Many instructions contain logical addresses of words in a register file. "Words" in a register file are also called "registers" in the register file. A typical register file contains 32 8-byte (64-bit) words. Some earlier computer systems typically used 4-byte, 2-byte, or even 1-byte words in their register files. Some computer systems have register files having more than 32 words, some have fewer than 32 words. As described above, register files provide "scratchpad" storage for data or addresses used by the processor. Typically, an instruction may reference more than one word in the register file. For example, an instruction may specify that two words in the register file should be added, with the results stored in a third word in the register file. To accomplish this, the instruction contains an opcode (operational code) for "add", and further contain the five-bit (for the exemplary 32 word register file) logical addresses for the two words to be added, and the five-bit logical address of the word to which the sum will be stored.

Register files are read and/or written during execution of most instructions. The high-speed nature of the register files and the frequent use of the register files make them tend to be "hot spots", that is, they dissipate more power per unit area than much of the rest of the chip and are therefore at a higher temperature. Higher temperatures tend to accelerate defects, making register files prone to developing failures. The repetitive nature of register files (a repetition of bits "horizontally" for words, with a number (e.g., 32) words arranged "vertically") allows for inclusion of a small number of redundant words. That is, a 32-word register file may physically have 33, 34, or more words, with one, two, or more words used as "spares" in case a defect introduced in manufacturing causes one or more of the 32 words (i.e., words 0–31) relied upon by the computer system to be faulty. In addition, the "spares" can be switched in if an error occurs during operation, although the computer system may have to backtrack and re-execute some instructions, or perhaps even have to re-start the task. Previously, addresses of identified faulty words were stored in an address compare unit and—when actually accessing the register file—compared with an address being used to fetch or store data in the register file. If the address being used to fetch or store data were the same as a stored faulty word, a first word line which activated all bits in the addressed word was held inactive, and a second word line was activated to access the redundant word. This was done during the actual fetch or store, which is typically a critical delay path that determines the frequency at which the processor would operate.

FIG. 1 illustrates a prior art example of such a conventional register file addressing scheme, accommodating a 32 word register file 17 (each word is also commonly known as a register in the register file). For simplicity, register file 17 includes a single port 19 through which data is read from or written into the register file. A register file addressing portion, generally designated as 10, of a computer system (not shown) comprises an instruction 11, fetched from a storage (not shown), typically an L1 cache. Instruction 11 contains a five bit register address which is coupled to a decode unit 13 by address bus 12. For simplicity, instruction 11 is shown to have only one register address; typically, instructions have more than one register address contained in the instruction. Decode 13 decodes the five bit address and activates one of 32 word lines in word line bus 14. Address bus 12 is also coupled to address compare 15, which compares (at the same time that decode 13 is decoding the address) the five bit address with one or more addresses that are known to address faulty words. Faulty words are identified during manufacturing tests of the semiconductor chip, during power on testing when the computer system is powered on, or during self diagnostics upon an error being detected during operation. For example, in the IBM Iseries computer system, a service processor is capable of responding to many error signals and diagnosing faults that resulted in the error signals. If the present five bit address matches an address of a faulty word, address compare 15 must immediately signal decode 13, before decode 13 can activate any of the 32 word lines, causing decode 13 to inhibit activating the one of 32 word lines corresponding to the address. Address compare 15, in addition, activates a redundant word line 16, which causes the contents of redundant word 18 to be accessed on register file port 19. Using this technique, redundant word 18 will always be used instead of the faulty word. The need to do an address compare in address compare 15 in time to inhibit decode 13 from activating one of 32 word lines is typically a cycle limiting path that limits the operating frequency of the computer system.

Therefore, a need exists to provide method and apparatus that allow a redundant word line in a register file to be accessed (fetched or stored) without having to compare, during the register file access, the address of word to be accessed to one or more faulty word addresses, and, respondent to an equal compare, suppressing access to the word in the logical address and accessing a redundant word.

SUMMARY OF THE INVENTION

The present invention generally provides methods and apparatus to access (fetch or store) a redundant word instead of an addressed word in a register file during a processor cycle without having to perform the steps of comparing the logical address of the word to one or more faulty addresses, inhibit access of the faulty word, and accessing the redundant word during the processor cycle.

In an embodiment, a method is disclosed that includes the steps of identifying a faulty word line; storing an address of the faulty word line; reading an instruction from a first storage; predecoding the instruction; modifying the instruction by replacing an address of a faulty word with an address of a redundant nonfaulty word; and storing the modified instruction in a second storage. Access by a processor of the word in the register file is done using the modified instruction, using the address of the nonfaulty word.

In an embodiment of a computer system, an instruction in a first storage contains an address of a word in a register file, the address of the word being "N" bits long, providing an "N"-bit logical addressing space. The instruction is predecoded as the instruction is moved from the first storage to a second storage. During predecoding, all register addresses in an instruction are changed to use "N+1" bits (or other suitable increase; an increase of one bit is used for exemplary purposes here). During the predecoding, each register address in the instruction is compared to one or more addresses known to be addresses of faulty words in the register file. Addresses of faulty words are mapped to redundant words in the "N+1" bit addressing space. Addresses of nonfaulty words are mapped to redundant nonfaulty words in the "N+1" bit addressing space; advantageously, the same word addressed by the "N" bit address. Although this mapping could accommodate a fault in every word in the "N"-bit logical addressing space, doing so would entail doubling the size of the register file. Advantageously, only one or two spare words are typically implemented.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Having reference now to the figures, and having provided above a discussion of the art, the present invention will be described in detail.

The present invention generally provides methods and apparatus to allow faster access to words in a register file having redundant words. The present invention expands the addressing space of each register address in an instruction during a predecode operation that occurs when the instruction is moved from a first storage to a second storage. Addresses of words in the register file that are known to be faulty are mapped to redundant words during the predecode operation. Addresses of the redundant words exist in the expanded addressing space. Addresses of the redundant words do not exist in the addressing space prior to expansion. All addresses used to access (fetch or store) the register file are the expanded addresses, and therefore do not address a word that is known to be faulty. Therefore, no address compare and subsequent "last minute" redundant word substitution action needs to be done during access of words in the register file.

Hereinafter, "original instruction" refers to an instruction prior to predecoding. Original instructions are instructions in the machine code of a particular computer, and may be written manually, or, more typically, by a compiler. "Predecoded instruction" refers to an instruction as expanded by a predecoder unit that will be described below. "Logical address" refers to an address of a word in a register file as stored in an original instruction. "Physical address" refers to an address having an expanded addressing space, stored in a predecoded instruction.

Figure 1:
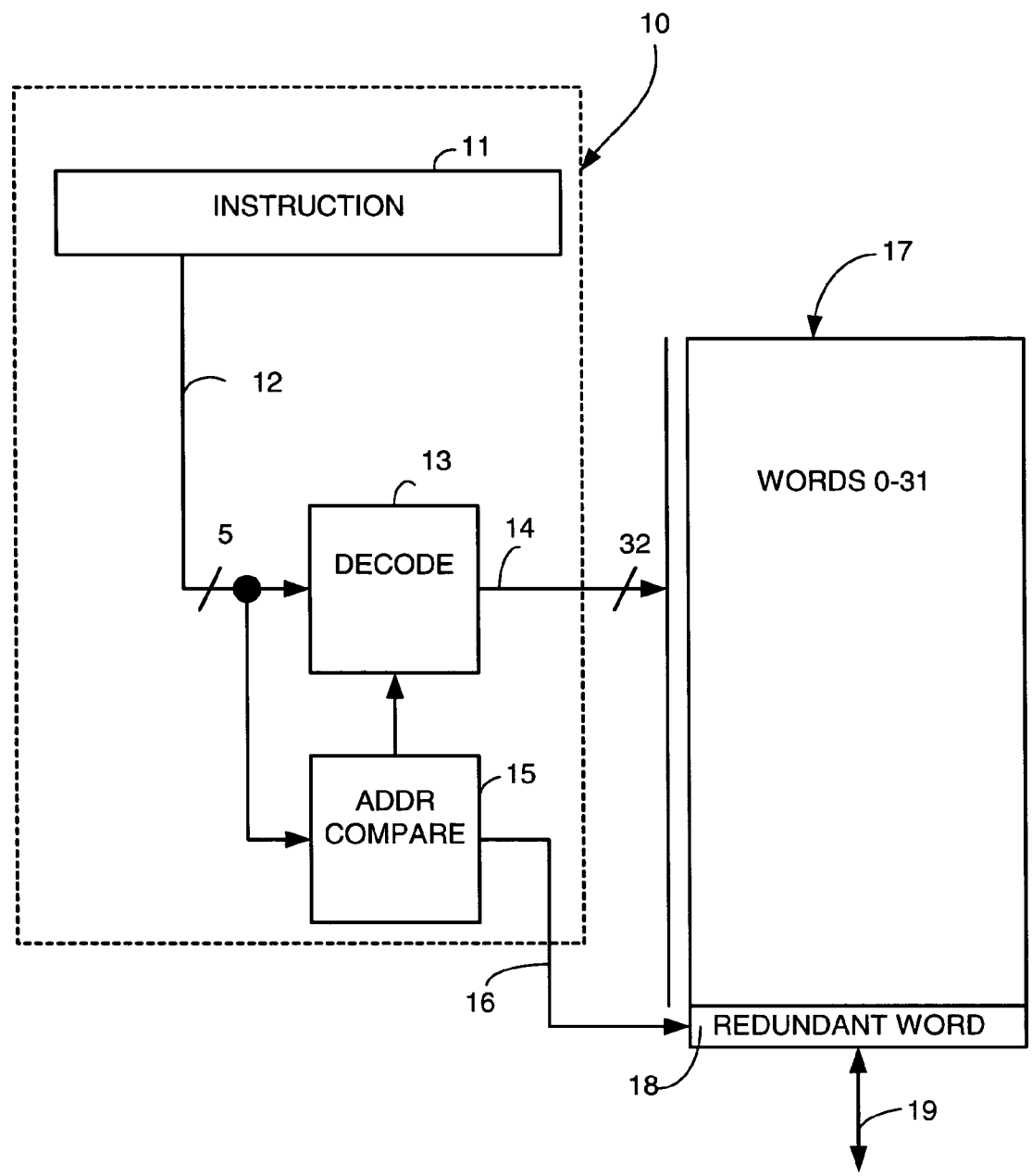
FIG. 1 is a block diagram of a prior art register file addressing portion of a conventional computer system having a redundant word in a register file.
Figure 2:
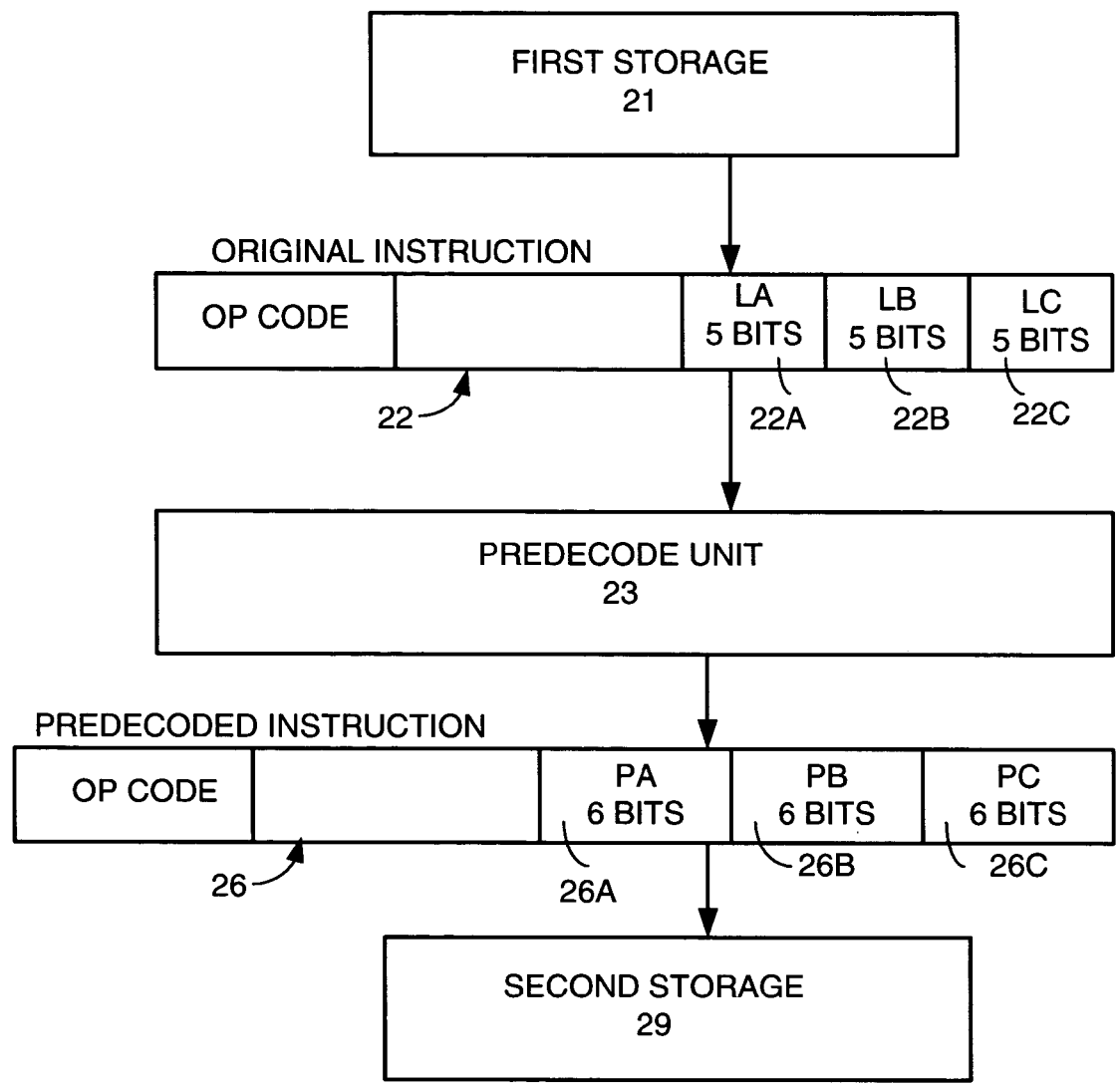
FIG. 2 shows a high level block diagram of a predecoding system according to the present invention.

Turning now to FIG. 2, a block diagram is shown that illustrates movement of an instruction from an original instruction 22 in a first storage 21 to a predecoded instruction 26 in a second storage 29, with a predecode unit 23 shown that expands the addressing space of each logical address in the instruction into a predecoded address. First storage 21 could be an L2 cache, an L3 cache, or even a computer system's main memory. Original instruction 22 shows an instruction as fetched from first storage 21. Instruction 22 has a predetermined number of bits, according to an architectural definition of a particular computer. For example, many smaller computers have a 32 bit instruction; larger computers often have a 64 bit instruction. Some computers even define different instructions to have different number of bits. The instruction contains an "operational code" (op code) that defines the type of operation the instruction specifies. For example, an op code might specify an "add" of the contents of two words in a register file with the contents to be placed in a third word in the register file. Another op code might specify that the contents of a first word be ANDed with the contents of a second word, with the results stored in a third word. Many instructions reference words in a register file. Therefore, many instructions have several groups of bits defined as logical addresses that address (point to) particular words in the register file. In an exemplary computer system, a register file contains 32 words. To address any word in this register file, a five bit logical address is needed. Original instruction 22 has provision for storing three five bit logical addresses, LA, LB, and LC, having reference numerals 22A, 22B, and 22C, respectively. For example if an ADD operation specifies adding the contents of word 3 to the contents of word 22 and storing the sum into word 8, LA would have a value of three; LB would have a value of 22; and LC would have a value of 8. In general, the number of logical addresses in an original instruction can be one, two, three, or more, according to an architecture of a particular computer system. The present invention contemplates any number of logical addresses contained in an original instruction.

Predecoded Instruction 26, which is stored in second storage 29, contains three six bit groups for physical addresses; that is, PA, PB, and PC, designated by reference numerals 26A, 26B, and 26C, respectively. Second storage 29 is typically an L1 Icache (Instruction Cache), but could be any level of storage below first storage 21. For example, if second storage 29 is an L1 cache, first storage 21 is an L2 cache. If second storage 29 is an L2 cache, then first storage 21 is an L3 cache (or a main store if the computer system does not have an L3 cache). A six bit physical address can uniquely address any word in a 64 word address space. Predecode unit 23 provides a mapping of the contents of the five bit logical addresses LA, LB, and LC of original instruction 22 to the six bit physical addresses PA, PB, and PC of instruction 26. The extra addressing space is used to address one or more redundant words in the register file. A detailed description of the mapping will be given shortly.

Figure 3:
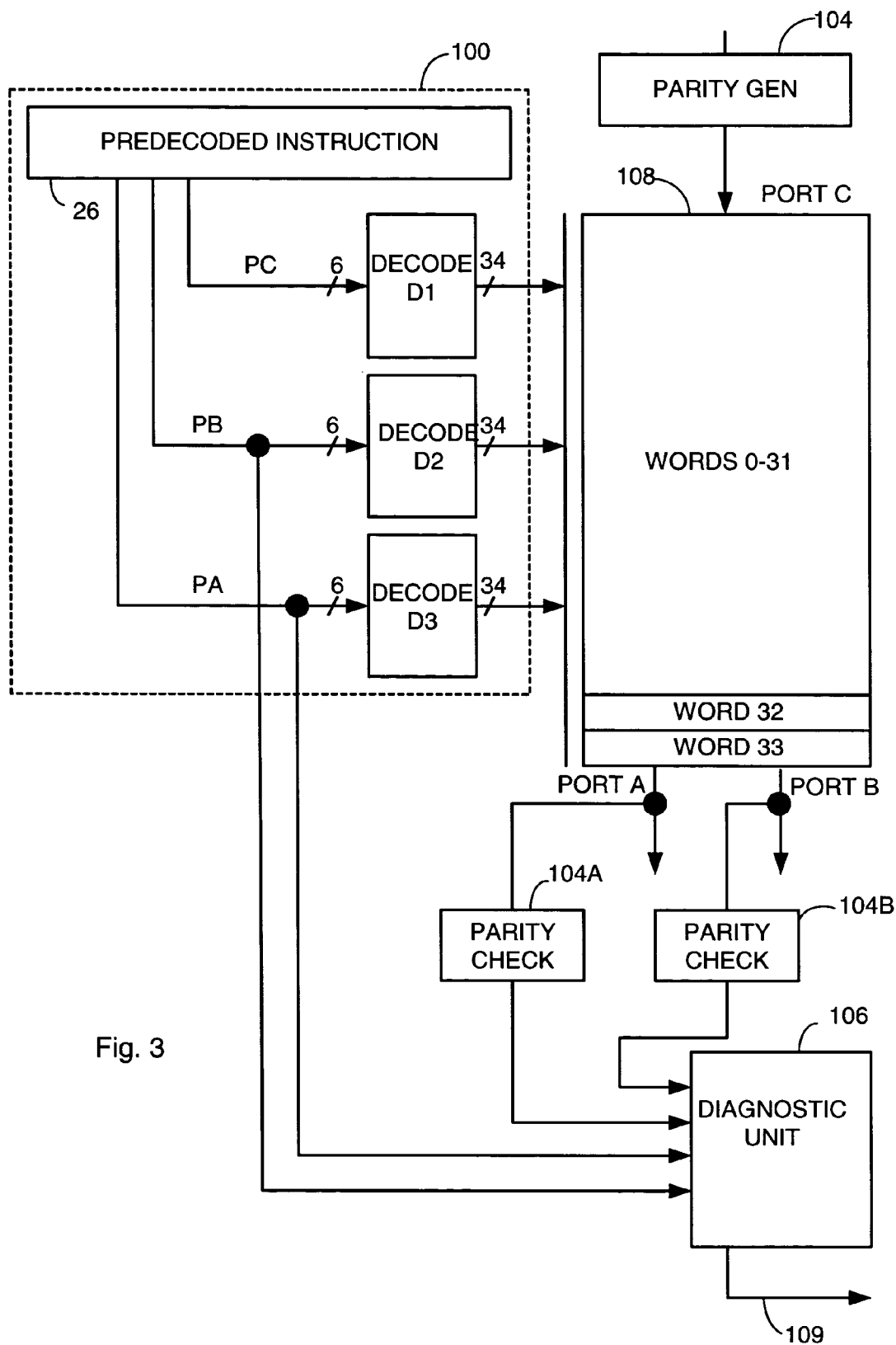
FIG. 3 shows a block diagram of a register file addressing portion of a computer system according to the present invention.

FIG. 3 shows a register addressing portion 100 of a computer system (not shown) according to the present invention, accommodating a 32 word register file 108. Register file 108 is shown to have two redundant words, word 32 and word 33. Logical addresses of the original instruction refer to words 0–31 in register file 108. Predecoded instruction 26 is taken from second storage 29 (FIG. 2) and has three six bit physical addresses used to access words in register file 108, including redundant words 32 and 33. Register file 108 is shown to have two read ports, PORT_A, and PORT_B, from which words addressed by physical addresses PA and PB from predecoded instruction 26 are output from the register file on PORT_A and PORT_B, respectively. Register file 108 is shown to have one write port, PORT_C, addressed by physical address PC of predecoded instruction 26. Data arrives into register file 108 through PORT_C and is stored in the word addressed by PC. Decodes D1, D2, D3 each activate one word line of the 34 word lines that each of Decode D1, D2, and D3 output, according to PC, PB, and PA, respectively. 32 of the word lines select words 0–31. A $33^{rd}$ word line selects word 32. A $34^{th}$ word line selects word 33. Typically, for space and bit line loading considerations, only one or two redundant words are implemented, however the present invention is limited only by the addressing space of the predecoded instruction. In the current example, up to 32 redundant words could be supported.

Testing of proper operation of register file 108 must be performed. For example, testing of the register file 108 is done during a manufacturing test of a semiconductor chip containing register file 108 before the semiconductor chip is shipped to a user. Many techniques are known to test a register file, including, but not limited to running manually generated input patterns and comparing the results against expected values; and Array Built-In Self Test (ABIST). During such testing, if a faulty word is detected, in an embodiment, storage of the address of the faulty word is provided on the semiconductor chip in nonvolatile storage, such as by blowing fuses on the chip. In addition, a word in the register file might become faulty after the chip has been shipped, or even after the chip has been in use for some time. In an embodiment, a register file is tested prior to shipping, with the number of faulty words noted. If the register file has at least as many redundant words as faulty words, the register file is accepted without burning fuses, leaving handling of mapping faulty words to redundant words to be done at system bring up testing (i.e., when the computer system is powered up), during which the same, or similar techniques as were used in manufacturing testing is performed. Many processors provide some means for continuously checking proper operation of register file 108. For example, Parity checkers 104A and 104B perform a parity check of data read from register file 108 from PORT_A and PORT_B. Parity generator 104C generates parity for data being written into register file 108 via PORT_C. Other means of continuously checking proper operation of register file 108 are known, including Error Correction Code implementations (not shown). If a parity error is found by parity check 104A or parity check 104B, the address of the word found to be faulty is used by a diagnostic routine in diagnostic unit 106 to alter the mapping done by predecode unit 23, thereby mapping the address of the faulty word to a redundant word. In an embodiment, diagnostic unit 106 signals an operating system (not shown) in the computer system to halt operation of the task being performed, and the operating system has a diagnostic routine that executes further testing procedures to test whether the faulty word is a "hard fail", rather than a "soft fail". In yet another embodiment, diagnostic unit 106, in cooperation with the operating system, together comprise a diagnostic routine that executes the further testing procedures. Soft fails occur when alpha particles disturb data in storage elements such as are used to store the words in register file 108. Soft fails are random events and are not the result of defects in the storage elements themselves. The diagnostic unit (or the operating system, depending on where a computer system designer chooses to place the function) writes known patterns, usually multiple times, to a register file, reads the patterns back out and checks for miscompares. If no miscompares are found, the fault is a soft error fault. If the fault in the faulty word is found to be a soft fail, remapping is not performed.

Figure 4:
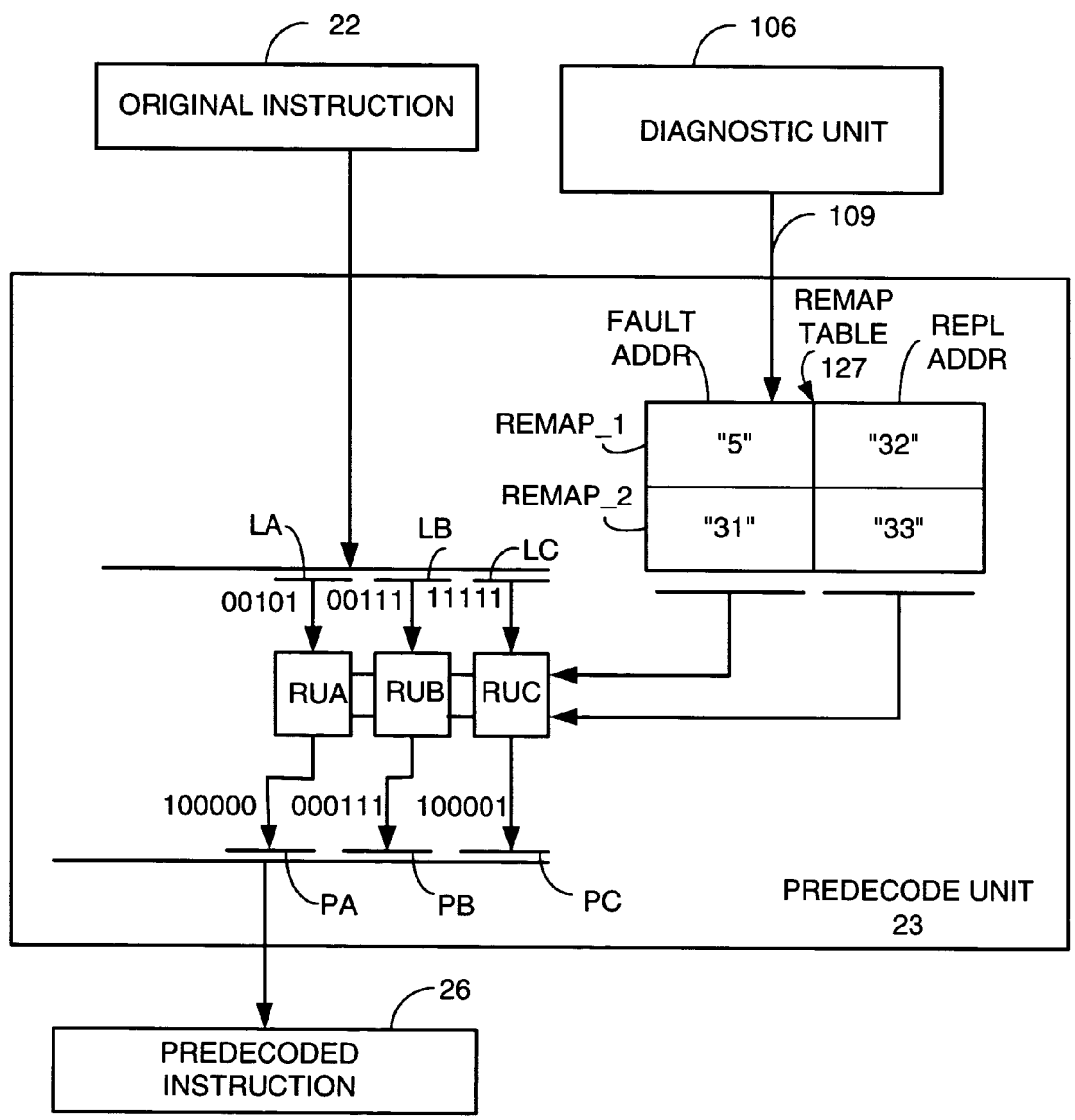
FIG. 4 shows a more detailed block diagram of a predecode unit portion of the predecoding system according to the present invention.

FIG. 4 is a block diagram showing in more detail than FIG. 2 details of the address mapping scheme of the current invention, in particular, predecode unit 23. A remap table 127 provides a table of fault addresses of logical addresses known to point to faulty words and corresponding "replacement" physical addresses that point to redundant words that are used instead of the faulty words. Remap table 127 comprises two columns, a fault address column and a replacement address column. Remap table 127 comprises a plurality of rows, each row containing a logical address fault address in the fault address column, and a physical address in the replacement address column. The exemplary remap table 127 is shown to have two rows, however additional rows are contemplated. In the example (i.e., five bit logical address and six bit physical address), up to 32 remap rows could be used, thereby accommodating 32 redundant words.

Remap table 127 is coupled to diagnostic unit 106 via signal 109. Diagnostic unit 106 writes fault addresses and replacement addresses into remap table 127. In the exemplary remap table 127, the left column (entitled "fault addr") contains addresses of faulty words; the right column (entitled "repl addr") contains replacement addresses. A word having a logical address in original instruction 22 (which had been mapped to the same physical address by predecode unit 23, prior to detection of the fault and subsequent remapping) has been identified as having a fault by a parity checker (e.g., parity checker 104A or parity checker 104B in the example of FIG. 3). Diagnostic unit 106, responding to the detection, provides a replacement address "32" for the faulty word. The word addressed by the replacement address "32" accesses register 32 in FIG. 3. Another fault address, which logically addresses word 31, is also in remap table 127. A replacement address or "33" was placed into the corresponding replacement address field by diagnostic unit 106. Remap table 127 is shown having two rows, each row having a fault address and a replacement address. As discussed above, although most applications will have one or two rows, the number or rows could be as high as the size of the address space expansion provided by the extra bit(s) in each address field in an instruction during the predecode operation.

Remap table 127 is coupled to remap units RUA, RUB, RUC. In an embodiment, remap table 127 is replicated in each remap unit RUA, RUB, and RUC. Remap units RUA, RUB, and RUC each compare a five bit logical address from original instruction 22 against each fault address in remap table 127, and, if a match occurs, substitute the corresponding six bit replacement address. If a match does not occur (i.e., the address does not point to a faulty word), the logical address from instruction 22, with a binary "0" appended to the most significant bit in the six bit address, is output by the remap unit. In the example, logical addresses "5" and "31" (stated in base 10 for simplicity) have been stored by diagnostic unit 106 in the "fault addr" column of remap table 127. Remap unit RUA compares the five bit address from LA of instruction 22 against all fault addresses in remap table 127. LA is shown to contain, in binary, 00101, which is "5" (in base 10); finds a match with "5" in the "fault addr" column, and outputs the corresponding replacement address "32" (in base 10), or, in binary, 100000. In other words, a five bit address having binary value "00101" is replaced by a six bit binary value "100000", which is used to access word 32 in register file 108. Remap unit RUB receives a five bit logical address "7" (i.e., 00111 binary) from LB in instruction 22. No match is found in a compare of "7" with all fault addresses in remap table 127. The five bits of the logical address are used as the five least significant bits of the six bit address output by remap unit RUB, with a "0" used as the most significant bit. In other words, a five bit address having binary value "00111" is replaced by a six bit binary value "000111", which still points to word seven in register file 108. Remap unit RUC receives a five bit logical address "31" (i.e., 11111 binary), which matches with a fault address in remap table 127. Diagnostic unit 106 has provided a corresponding replacement address in remap table 127 of "33". Remap unit RUC outputs a six bit address of "33" (i.e., 100001 binary). The three six bit predecoded addresses resulting from this remap operation are stored in predecoded instruction 26.

The above discussion, for simplicity, describes predecoding a single instruction at a time. In practice, in large, modern computer systems, a plurality of instructions is fetched from a first storage simultaneously, and is predecoded at the same time. For example, in an embodiment (not shown), four original instructions are fetched simultaneously from the first storage. A predecode unit capable of simultaneously remapping twelve addresses receives the four instructions and outputs four predecoded instructions for storage into the second storage. The present invention contemplates any number of instructions being predecoded at a time.

Figure 6:
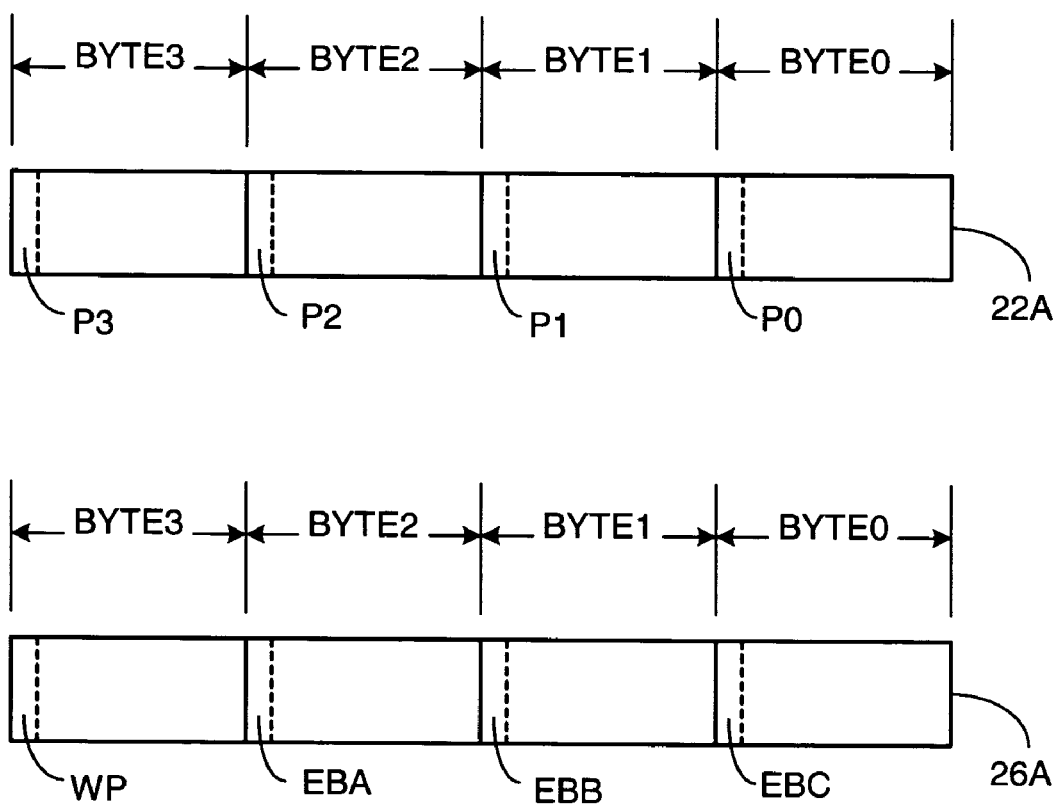
FIG. 6 shows a four byte original instruction having byte parity and a four byte predecoded instruction having word parity, with the three bits used for address bit expansions.

For simplicity, the above description has used example original and predecoded instructions not having parity or ECC. In practice, most modern computer systems employ parity, ECC, or other error checking and/or detection features to increase the integrity of the computer system. For example, in FIG. 2, original instruction 22 is shown to be "shorter" than predecoded instruction 26 in the figure due to the expansion of the five bit LA, LB, and LC addresses into the six bit PA, PB, and PC addresses. A 32 bit original instruction 22 requires, if three five bit addresses are each expanded to six bit addresses, a 35 bit predecoded instruction. In many cases, this is not a problem, as the second storage 29 is typically an instruction cache that can simply be made with words that are three bits wider. However, predecode unit 23 and second storage 29 are typically built on a semiconductor chip. Having no interconnections (wiring, module couplings, or even cabling) off the semiconductor chip, reliability of predecode unit 23, second storage 29, and couplings between them are relatively reliable. In an embodiment, predecoded instruction 26 can be of equal number of bits as the original instruction by using some of the corresponding bit positions that, in the original instruction, were used as checking bits (e.g., parity bits or ECC bits) to store the bits added to the addresses during the predecode operation. FIG. 6 shows a 32 bit original instruction having byte parity. That is, original instruction 22A contains four bytes, each byte having eight data bits and a parity bit. Instruction 22A therefore has a total of 36 bits. Byte0 of original instruction 22A has parity bit P0; byte1 has parity bit P1; byte2 has parity bit P2; byte3 has parity bit P3. Predecoded instruction 26A, because of higher reliability inherent with on chip devices and interconnections, has only a "word parity" WP bit for the entire predecoded instruction 26A. EBA is an "extended bit" for address PA (that is, the sixth bit used in the physical address) is stored in EBA. Likewise, EBB and EBC contain the sixth bits (extended bits) of physical addresses PB and PC. Predecoder 23 generates word parity in this embodiment. Using word parity instead of byte parity, in the example of three five bit logical addresses, each of which is expanded to six bit physical addresses, allows predecoded instruction 26A to have the same number of total bits (i.e., 36 bits, including a WP bit, 32 bits of data, and three "extended bits") as original instruction 22A. Note that, in general, second storage 29 contains only instructions (i.e., an I-cache), and, since modern computers typically do not modify contents of an I-cache, when an old cache line is discarded from an I-cache to bring in a new cache line, no provision is made to store the old cache line, and it is simply written over by the new cache line. However, if checking bit positions have been used as described above to contain bits from expanded addresses, and the computer system does store the cache line using the checking bits for expanded addresses, provision must be made in a directory (not shown) in the computer system to flag the cache line as having been predecoded, thereby alerting checking elements (e.g., parity checkers or ECC checkers) of the different allocation upon subsequent use of the cache line. Predecoder 23 also reads the directory and passes such already predecoded instructions to the second storage 29 without again predecoding.

Figure 5:
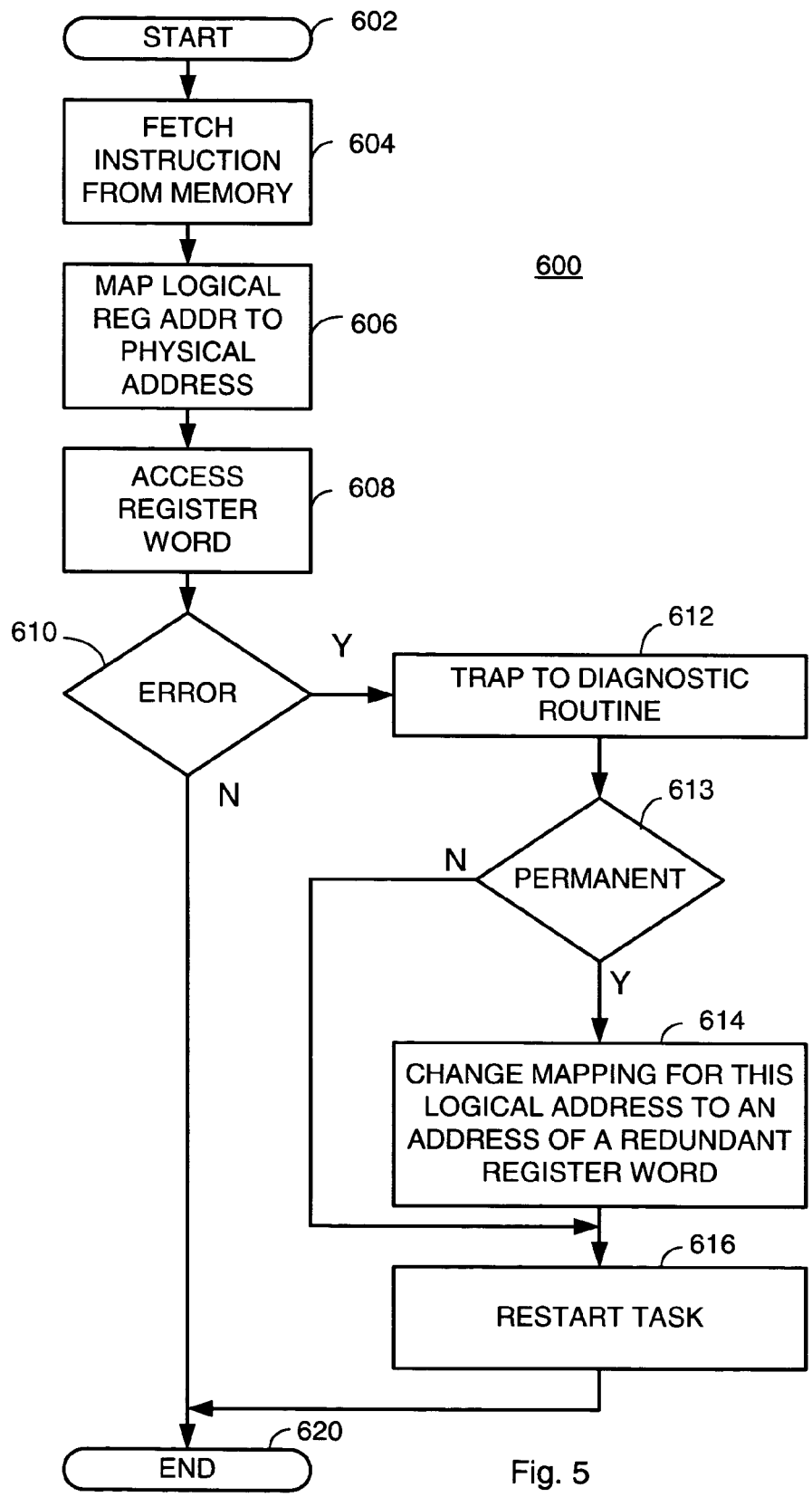
FIG. 5 shows a flow chart of a method used to identify a faulty word in a register file and to change a predecoder mapping of the address of the faulty word.

FIG. 5 shows a block diagram of a method used in a computer system that predecodes an instruction, remapping a logical address to a physical address having a larger addressing space than the logical address to map a logic address that points to a faulty word in a register file to a redundant word in the register file.

Block 602 begins the method. In block 604, an instruction is fetched from a first storage. The storage could be the computer system's main memory, or a cache at a particular level of the computer system's cache hierarchy. The instruction contains one or more logical addresses, each logical address pointing to a word in a register file in the computer system. Each of the one or more logical addresses has a first number of bits defining a first addressing space. In block 606, each logical address is mapped to a physical address, the physical address having a second number of bits larger than the first number of bits, defining a second addressing space larger than the first addressing space. Any logical address that points to a word in the register file that is not faulty is mapped to a physical address within the first addressing space the physical address being equal to the logical address, although containing one or more high order bits. Any logical address that points to a word in the register file that is faulty is mapped to an address that points to a word in the second addressing space that is not in the first addressing space. In block 608 the physical address is used to access a word in the register file. In block 610, error checking, such as parity checking or error correcting code checking is performed on data accessed from the word in the register file. If no error is detected on the data accessed from the word in the register file, the data is used by the computer system and control transfers to block 620. The method is repeated for every instruction fetched from the storage. If an error is detected in block 610, control traps to a diagnostic routine in step 612. The diagnostic routine verifies that the error is not a temporary error, such as a soft error. If the error is a temporary error, control passes to block 616 where the current task is restarted. Upon determining that the error is a permanent error (also known as a "hard" error), control passes to block 614, which changes the mapping for the logical address to a physical address pointing to a redundant word in the register file, the redundant word being in the second address space, but not in the first addressing space defined by the logical address. After remapping the address, control passes to block 616 that restarts the task.

While the foregoing is directed to embodiments of the present invention, other and further embodiments of the invention may be devised without departing from the basic scope thereof, and the scope thereof is determined by the claims that follow.

What is claimed is:

1. A method for using a redundant word in a register file in place of a faulty word in the register file comprising the following steps:
    fetching an original instruction from a first storage;
    mapping a logical address having a logical addressing space in the original instruction to a physical address having a physical addressing space, the physical addressing space being larger than the logical addressing space;
    if the logical address points to the faulty word in the register file, making the physical address the address of the redundant word, the redundant word being in the physical addressing space, but the redundant word not being in the logical addressing space; and
    if the logical address does not point to the faulty word in the register file, using the logical address as the physical address.

2. The method of claim 1, further comprising the step of storing the physical address into a predecoded instruction.

3. The method of claim 2, wherein the original instruction has a plurality of checking bits, the step of storing the physical address into the predecoded instruction further comprising the step of using a bit in the predecoded instruction corresponding to a checking bit in the original instruction to accommodate the larger physical addressing space of the physical address, allowing the predecoded instruction to have an equal number of bits as the original instruction.

4. The method of claim 2, further comprising the step of storing the predecoded instruction into a second storage.

5. The method of claim 2, further comprising the step of:
    fetching the predecoded instruction from the second storage; and
    using the physical address in the predecoded instruction by a decode to access a word in the register file, where a redundant word can be accessed by the decode.

6. The method of claim 1, wherein the step of using the logical address as the physical address comprises the steps of:
    using the logical address as a group of lower order bits in the physical address; and
    placing one or more binary "0" bits as a group of higher order bits in the physical address;
    wherein the physical address consists of the lower order bits in the physical address and the higher order bits in the physical address.

7. The method of claim 1 further comprising the steps of:
    identifying a faulty word in the register file;
    determining if a fault in the faulty word is a soft fail or a hard fail;
    if the fault is hard fail, changing the mapping of the logical address to the physical address of the redundant word; and
    if the fault is a soft fail, not changing the mapping of the logical address to the physical address of the redundant word.

8. A computer system comprising:
    a register file having a number of words within an addressing space of a logical address, and a redundant word not addressable by the logical address;
    a predecode unit that maps the logical address to a physical address, the physical address having a larger address space than the logical address;
    a register addressing portion capable of accessing any word within the addressing space of the physical address, without use of an address compare; and
    a diagnostic unit capable of identifying a faulty word in the register file and controlling the predecode unit to map the logical address to a physical address responsive to the identity of the faulty word.

9. The computer system of claim 8, wherein the logical address is stored in an original instruction and the physical address is stored in a predecoded instruction.

10. The computer system of claim 9, wherein the original instruction contains a plurality of logical addresses and the predecoded instruction contains a plurality of physical addresses.

11. The computer system of claim 10, wherein the first storage is a third level cache and the second storage is a second level cache.

12. The computer system of claim 9 further comprising:
    a first storage containing the original instruction, the predecode unit coupled to the first storage and capable of reading the original instruction from the first storage; and
    a second storage coupled to the predecode unit and capable of receiving a predecoded instruction from the predecode unit.

13. The computer system of claim 12 wherein the predecode unit is capable of reading a plurality of original instructions from the first storage simultaneously and the second storage is capable of receiving a plurality of predecoded instructions simultaneously from the predecode unit.

14. The computer system of claim 12, wherein the first storage is a second level cache and the second storage is a first level cache.

15. The computer system of claim 9, further comprising:
    a checking bit in the original instruction; and
    an extended bit in the predecoded instruction in a bit corresponding to the checking bit in the original instruction used to accommodate the larger addressing space of the physical address in the predecoded instruction, allowing the predecoded instruction to be the same number of bits as the original instruction.

16. The computer system of claim 8, the diagnostic unit further comprising:
- a diagnostic routine capable of determining if the faulty word has a soft fail or a hard fail, and only controlling the predecode unit to map the logical address to a physical address responsive to the identity of the faulty word if the faulty word has a hard fail.

17. The computer system of claim 8, the predecode unit further comprising:
- a remap table having a fault address column and a replacement address column and a number of rows, each row containing a fault address that is the logical address of a faulty word and a replacement physical address that points to a redundant word in the register file; and
- a remap unit, coupled to the logical address, to the remap table, and to the predecoded instruction, that compares the logical address to all of the fault addresses in the remap table, and, if a match occurs, stores the corresponding replacement address in the physical address in the predecoded instruction, but storing the logical address in the least significant bits of the physical address in the predecoded instruction, with one or more binary "0"s in one or more most significant bits of the physical address, if no matches are found.

18. The computer system of claim 17, wherein the remap table is included in the remap unit.

* * * * *